(12) United States Patent
Okada et al.

(10) Patent No.: US 7,382,041 B2
(45) Date of Patent: Jun. 3, 2008

(54) ORGANIC-INORGANIC COMPOSITE INSULATING MATERIAL FOR ELECTRONIC ELEMENT, METHOD OF PRODUCING SAME AND FIELD-EFFECT TRANSISTOR COMPRISING SAME

(75) Inventors: Shinsuke Okada, Saitama (JP); Masaki Hirakata, Kanagawa (JP); Miho Watanabe, Kanagawa (JP); Taishi Shigematsu, Kanagawa (JP); Shigeki Ooma, Kanagawa (JP); Chikara Manabe, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 11/172,980

(22) Filed: Jul. 5, 2005

(65) Prior Publication Data

US 2006/0138404 A1    Jun. 29, 2006

(30) Foreign Application Priority Data

Dec. 24, 2004    (JP) .............................. 2004-373200

(51) Int. Cl.
    *H01L 23/58*    (2006.01)
(52) U.S. Cl. .............................. 257/642; 257/E23.119; 257/E21.259
(58) Field of Classification Search ................ 257/642, 257/E23.119, E21.259
    See application file for complete search history.

(56) References Cited

U.S. PATENT DOCUMENTS 5,063,125 A * 11/1991 Yuh et al. ................ 430/58.75
2003/0165710 A1 * 9/2003 Kuramoto et al. .......... 428/689
2005/0040377 A1 * 2/2005 Drotleff et al. ............. 252/586
2005/0288415 A1 * 12/2005 Beers et al .................. 524/425
2006/0024757 A1 * 2/2006 Hussa et al. ................. 435/7.2
2006/0054866 A1 * 3/2006 Ait-Haddou et al. .... 252/378 R
2006/0127683 A1 * 6/2006 Hara et al. ................... 428/447
2006/0175585 A1 * 8/2006 Drotleff et al. ............. 252/582
2006/0182941 A1 * 8/2006 Yano et al. ............... 428/292.1
2006/0199273 A1 * 9/2006 Rabe et al. .................. 436/174

FOREIGN PATENT DOCUMENTS

JP    A 2003-338551    11/2003
JP    B2 3515507 B    1/2004

OTHER PUBLICATIONS

Dimitrakopoulos et al., "Organic Thin Film Transistors for Large Area Electronics," *Advanced Materials 2002*, vol. 14, No. 2, pp. 99-117 {Jan. 16, 2002}.

Jung et al., "Creation of Novel Helical Ribbon and Double-Layered Nanotube $TiO_2$ Structures Using an Organogel Template," *Chem. Mater 2002.*, No. 14, pp. 1445-1447 {Mar. 19, 2002}.

Sugiyasu et al., "Double Helical Silica Fibrils By Sol-Gel Transcription of Chiral Aggregates of Gemini Surfactants," *Chem. Commun.*, pp. 1212-1213 {May 3, 2002}.

* cited by examiner

*Primary Examiner*—Ngan Ngo
(74) *Attorney, Agent, or Firm*—Oliff & Berridge, PLC

(57) ABSTRACT

A method of producing an organic-inorganic composite insulating material for electronic element comprises subjecting a mixture of an organic polymer or its solution and a metal alkoxide or its solution as a starting material to sol-gel reaction of the metal alkoxide in the presence of the organic polymer.

3 Claims, 5 Drawing Sheets

REACTION SCHEME FOR INTRODUCTION OF
CARBOXYL GROUP IN CARBON NANOTUBE

FIG. 4

REACTION SCHEME FOR METHYLESTERIFICATION
OF CARBON NANOTUBE

FIG. 5

REACTION SCHEME FOR POLYMERIZATION REACTION OF CARBON NANOTUBE CABOXYLIC ACID METHYL ESTER WITH GLYCERIN BY ESTER EXCHANGE

ORGANIC-INORGANIC COMPOSITE INSULATING MATERIAL FOR ELECTRONIC ELEMENT, METHOD OF PRODUCING SAME AND FIELD-EFFECT TRANSISTOR COMPRISING SAME

BACKGROUND OF THE INVENTION

1. Field of the Invention

The present invention relates to an organic-inorganic composite insulating material which can be preferably used in various fine electronic elements and a method of producing same. The present invention also relates to a field-effect transistor comprising the organic-inorganic composite insulating material for electronic element.

2. Description of the Related Art

In recent years, organic semiconductor devices have been extensively studied aiming at the development of new application different from that of related art silicon semiconductor devices. Among these devices, organic thin film transistors (OTFT) formed on a flexible substrate such as plastic sheet have become of particular interest. Examples of the preparation of these organic thin film transistors have been reported. Thus, further enhancement of performance have been expected (see "Advanced Material", 2002, No. 2, page 99).

Of course, the enhancement of the performance of semiconductor layer is essential for the enhancement of the performance of PTFT. In addition, the selection of the structure and member through which the performance of semiconductor layer can be sufficiently drawn, particularly the enhancement of the performance of the insulated gate layer is indispensable. Further, since the preparation of the silicon oxide gate insulating film requires the highest temperature heat treatment at the silicon semiconductor process, it is required that the insulated gate film be prepared at a temperature as low as not higher than the heat-resisting temperature of plastic substrate (resin substrate).

On the other hand, in order to make the use of the cost advantage of plastic substrate, a simple process for the preparation of elements involving spreading such as ink ejection and spin coating or a process for the preparation of elements requiring no high temperature heat treatment is required.

The requirements for insulated gate film in OTFT on a flexible substrate are (1) no damage such as crack despite the bending of the substrate (flexibility), (2) producibility by spin coating or like method, (3) producibility at low temperatures, (4) chemical resistance, (5) high dielectric constant, and (6) high insulation resistance (electric strength).

Most of the materials of insulated gate film for OTFT on flexible substrate which have heretofore been reported are inorganic materials such as inorganic oxide and organic polymers. However, these materials can difficultly meet all the aforementioned requirements.

Insulating films made of these inorganic materials exhibit a high dielectric constant but lack flexibility. On the other hand, insulating films made of organic polymers are flexible. However, insulating films made of phenolic resin exhibit a relatively high dielectric constant but lack dielectric strength. Insulating films made of polyimide exhibit a strong chemical resistance but require a high temperature heat treatment to obtain its chemical resistance. Thus, insulating films made of organic polymers can meet some of these requirements but some other requirements. It is extremely difficult for these insulating films to meet all these requirements.

Japanese Patent No. 3,515,507 proposes that an organic polymer and an inorganic material be mixed to provide the resulting insulating film with flexibility and high dielectric constant. In accordance with this reference, a powder obtained by mechanically grinding a ferroelectric material such as barium titanate is dispersed in an organic polymer to compensate the dielectric constant of the resulting insulated gate film and hence lower the gate voltage required for the operation of transistor.

However, when this method is used, the thickness of the insulating film is limited to the size of the inorganic material thus ground. Further, since a solid material is dispersed in an organic polymer solution, an uneven dispersion is formed, possibly causing the generation of local electric field and concurrent dielectric breakdown during the operation of transistor. Moreover, since the inorganic material is merely present in the organic polymer and thus doesn't compensate the chemical resistance of the insulating film, the resulting insulating film cannot be subjected to any processes involving the use of solvents.

JP-A-2003-338551 discloses a technique of forming a thin ceramics film as an insulating film on the surface of silicon wafer by a sol-gel method allowing a low temperature treatment. In accordance with this technique, the resulting thin ceramics film can be prevented from being cracked, making it possible to efficiently produce electronic parts having a high reliability. However, the thin ceramics film is an insulating film made of an inorganic material that can be applied to silicon wafer, which is nonflexible and hard, but cannot be applied to flexible substrates.

On the other hand, in an attempt to obtain a uniformly dispersed organic-inorganic mixture system as an ordinary material technique, it has been practiced to prepare a composite film from a mixture of a solution of metal alkoxide which is a precursor of inorganic oxide and an organic polymer solution by a sol-gel method. In this case, it is expected that as the dispersion of organic polymer is made more on monomolecular level, the thermal stability of the organic polymer is enhanced more.

Referring to the mutual action of metal alkoxide with organic polymer, it has been reported that when a polymer or molecules capable of making hydrogen bond such as hydroxyl group or electrostatic mutual action are present in a metal alkoxide solution, a sol-gel polycondensation proceeds selectively on the surface of the compound to form a dried gel ("Advanced Material", 2002, No. 2, page 99).

However, the mixing of metal alkoxide and organic polymer has been limited to the doping of organic dye molecules as optical material with a high dispersion, the use of an organic polymer as a mold for the purpose of finally burning away the organic polymer to form a porous oxide film or the academic studies of mutual action of the two materials.

SUMMARY OF THE INVENTION

The present invention has been made in view of the above circumstances and provides an organic-inorganic composite insulating material for electronic element which exhibits an excellent flexibility and so high a dielectric constant and dielectric strength as to keep electronic elements such as transistor high-performance while realizing high adaptability to preparation process and cost reduction and a method of producing same. The invention also provides a field-effect transistor comprising an organic-inorganic composite insulating material for electronic element having such excellent properties.

The method of the invention of producing an organic-inorganic composite insulating material for electronic element comprises subjecting a mixture of anorganic polymer or its solution and a metal alkoxide or its solution as a starting material to sol-gel reaction of the metal alkoxide in the presence of the organic polymer. Further, the organic-inorganic composite insulating material for electronic element of the invention is obtained by the aforementioned production method and comprises an organic polymer dispersed in an inorganic polymer structure.

In accordance with the aforementioned production method and the aforementioned organic-inorganic composite insulating material for electronic element, a mixture of an organic polymer or its solution and a metal alkoxide or its solution as a starting material is subjected to sol-gel reaction of the metal alkoxide in the presence of the organic polymer to form a dried gel (inorganic polymer). As a result, a film having an organic polymer dispersed in an inorganic polymer structure can be prepared, making it possible to provide an insulating film which can be prepared at low temperatures and exhibits flexibility, which is one of characteristics of organic polymers, while making the use of characteristics of inorganic films, i.e., dielectric constant, chemical resistance. For example, an insulated gate film for field-effect transistor can be provided as described later. In particular, since the insulating film of the invention can be simply produced by coating, it can be easily formed on resin substrates which cannot withstand high temperatures. Thus, the insulating film of the invention can attain a high adaptability to preparation process and realize cost reduction.

On the other hand, the field-effect transistor of the invention comprises: a substrate, at least three electrodes comprising a source electrode, a drain electrode and a gate electrode, each of which is formed on a site of the substrate; a transporting layer that transports carrier depending on the voltage applied to the electrodes, the transporting layer being formed on the surface of the substrate; and an insulated gate film that transmits the voltage applied to the gate electrode to the transporting layer, wherein the insulated gate film comprises the aforementioned organic-inorganic composite insulating material for electronic element of the invention.

In accordance with the invention, as the aforementioned insulated gate film there is used the aforementioned organic-inorganic composite insulating material for electronic element having excellent characteristics, which can be prepared at low temperatures and has properties characteristic of inorganic insulating film and organic polymer in combination, making it possible to obtain a field-effect transistor which has a high dielectric constant and chemical resistance as well as a high flexibility.

BRIEF DESCRIPTION OF THE DRAWINGS

Preferred embodiments of the present invention will be described in detail based on the following figure, wherein.

DETAILED DESCRIPTION OF THE INVENTION

The invention will be further described hereinafter.

Method of Producing an Organic-Inorganic Composite Insulating Material for Electronic Element A solution of metal alkoxide is spread to obtain an oxide-film. The process of obtaining the oxide film involves two steps, i.e., gelation by sol-gel polycondensation and vitrification by sintering.

In the sol-gel polycondensation step, a metal alkoxide is subjected to hydrolysis/polycondensation at a temperature of about 100° C. to form an inorganic polymer structure. Subsequently, water and organic materials which have been produced by this reaction are evaporated by heating to about 150° C. to produce a state called dried gel. The dried gel is further heated and sintered at about 500° C. to become vitrified. The vitrified material is a hard and brittle film which cannot act as an insulated gate film on a flexible substrate. Even the dried gel of inorganic polymer which has not yet been sintered lacks flexibility as compared with organic polymers.

The film of the invention comprises an organic polymer dispersed in an inorganic polymer structure (matrix), making it possible to provide flexibility characteristic of organic polymers while maintaining dielectric constant and chemical resistance characteristic of inorganic polymers. The invention is also characterized in that in order to extremely fairly disperse the organic polymer in the inorganic polymer molecules, a mixture of a solution of organic polymer and a solution of metal alkoxide as a starting material is subjected to sol-gel polycondensation in the presence of an organic polymer to form an inorganic polymer network.

Referring to the mixing ratio of the organic polymer in the inorganic polymer, the volume ratio of the organic polymer in the composite film is preferably from 1% to 50% to prevent the organic polymer from making phase separation in the composite film. Further, in order to keep the composite film flexible while maintaining dielectric constant and chemical resistance characteristic of organic polymers for the purpose of obtaining a flexible field-effect transistor or like purposes, the volume ratio of the organic polymer is more preferably from 10% to 30%.

Metal Alkoxide

The kind of the metal alkoxide to be used in the invention may be properly predetermined depending on the desired properties of the insulating film. In some detail, alkoxides of at least one selected from the group consisting of aluminum, silicon, hafnium, lanthanum, tantalum, zinc, tin, nickel, magnesium, indium, chromium, lead, manganese, iron, palladium, tungsten, molybdenum, vanadium, cobalt, cerium, bismuth, gallium, niobium and zirconium may be used.

For example, in the case where the composite insulating film is used as an insulated gate film for field-effect transistor, a precursor metal alkoxide which is an oxide having a dielectric constant of from about 10 to 40 is preferably used taking into account the required dielectric constant. Specific examples of such a metal include aluminum, titanium, hafnium, lanthanum, tantalum, zinc, vanadium, zirconium, polonium, and yttrium. Preferred among these metals are aluminum, hafnium, lanthanum, and tantalum.

The dielectric constant of the various metal oxides will be given below.

[$Al_2O_3$: 10; $TiO_2$: 40; $HfO_2$: 20; $Ta_2O_5$: 25; $La_2O_3$: 21; $ZrO_2$: 23; $Pr_2O_3$: 31; $Y_2O_3$: 15]

Organic Polymer

It is preferred that the organic polymer to be used in the invention make hydrogen bond to metal alkoxide or electrostatic mutual action with metal alkoxide. Specific examples of the organic polymer include polyvinyl alcohol, polyvinyl phenol, poly(N-vinyl pyrrolidinone), and polyethylene glycol.

The organic polymer preferably has a hydroxyl group. It is particularly preferred that the organic polymer is a polyvinyl phenol.

The metal alkoxide solution normally contains water or alcohol and thus is normally required to be soluble in these solvents. Specific examples of the metal alkoxide include organic polymers having hydroxyl group (—OH), polymers having amide group (—CONH—), polymers having carboxyl group (—COOH), and polymers having sulfo group (—$SO_3H$). Particularly preferred among these organic polymers are organic polymers having hydroxyl group (—OH) from the standpoint of reaction with metal alkoxide and dissolution in water or alcohol-based solvents. Taking into account the properties such as dielectric strength of insulated gate film for TFT, apolyvinyl phenol (PVPh), which has heretofore been reported with reference to insulated gate film material for organic TFT (thin film transistor), is most desirable.

Solution Mixture

The aforementioned organic polymer and metal alkoxide are dissolved in a proper solvent to prepare a solution mixture which is a starting material of sol-gel reaction as described later. During this procedure, the organic polymer and the metal alkoxide may be dissolved in the respective proper solvent before being mixed to prepare a desired solution mixture. Alternatively, the two components may be dissolved in one solvent. In the former case, the solvent for dissolving the organic polymer therein and the solvent for dissolving the metal alkoxide therein may be the same or different. The two different solvents, if used, are, of course, required to be compatible with each other.

The formulation of the aforesaid solution mixture cannot be unequivocally predetermined, but the mixing ratio of the aforementioned metal alkoxide is preferably from 1 to 20% by weight, more preferably from 3 to 10% by weight. When the mixing ratio of the aforementioned metal alkoxide is too small, the sol-gel reaction proceeds uncertainly to disadvantage. On the contrary, when the mixing ratio of the aforementioned metal alkoxide is too great, it can cause cracking to disadvantage.

On the other hand, the mixing ratio of the organic polymer is preferably from 1 to 20% by weight, more preferably from 3 to 10% by weight. When the mixing ratio of the aforementioned metal alkoxide is too small, the resulting film lacks flexibility to disadvantage. On the contrary, when the mixing ratio of the aforementioned metal alkoxide is too great, the sol-gel reaction of metal alkoxide is impaired to disadvantage.

Sol-gel Reaction

In the organic-inorganic composite insulating material for electronic element of the invention and the method of producing same, the aforementioned solution mixture as a starting material is subjected to sol-gel reaction. In other words, the invention is characterized in that the aforementioned metal alkoxide is subjected to sol-gel reaction in the presence of the aforementioned organic polymer.

In the sol-gel reaction which is usually effected, a solution obtained by adding water and an acid or ammonia as catalyst required for hydrolysis to an alcohol solution of metal alkoxide is used as a starting material. By heating the solution to about 100° C., the metal alkoxide undergoes hydrolysis and polycondensation to form a sol having a microstructure constituting a metal oxide network dispersed in a solution. When the reaction proceeds further, the network extends throughout the sol to form a gel.

When the hydrolysis/polycondensation of the metal alkoxide proceeds in the presence of an organic polymer that mutually acts with the metal alkoxide, a sol-gel reaction proceeds preferentially on the surface of the molecules of the organic polymer. As a result, a film having an organic polymer dispersed extremely fairly therein can be obtained.

In order to keep the organic polymer dispersed in the film, it is necessary that the organic polymer have a sufficient solubility in an alcohol or water which is a solvent for the starting material solution. A self-assembling organic polymer is not desirable because it is not dispersed and thus can form a phase-separated film.

The mixture of organic polymer and metal alkoxide to be used in the invention is heated to about 100° C. for 1 hour to cause the metal alkoxide to undergo hydrolysis/polycondensation, thereby preparing a gel having an organic polymer dispersed therein. The gel thus formed is in the form of so-called swollen gel containing water produced by the reaction of the metal alkoxide.

Subsequently, the swollen gel is heated to about 180° C. for several hours to form a so-called dried gel free of water content, etc. which is then used as a composite insulating film. In general, a dried gel film prepared from a metal alkoxide alone is brittle. In the invention, however, the organic polymer is fairly dispersed in the gel, making it possible to prepare a film having a sufficient strength.

The aforementioned conditions such as temperature and time are not limited in the invention but may be properly adjusted depending on the material used and other various conditions.

Usage of Organic-inorganic Composite Insulating Material for Electronic Element

The organic-inorganic composite insulating material for electronic element of the invention is useful as an insulating film for various electronic elements. The organic-inorganic composite insulating material for electronic element of the invention is useful particularly for insulating film required to have high dielectric constant, dielectric strength and chemical resistance (including solvent resistance). Since the organic-inorganic composite insulating material for electronic element of the invention can be simply at low temperatures by a coating method, a high adaptability to preparation process and cost reduction can be realized. Thus, the invention can be widely applied without selecting the kind of the substrate and the production conditions, making it possible to contribute to the preparation of a variety of electronic elements.

Specific examples of the electronic element to which the invention can be applied include field-effect transistor as described later, capacitor, etc.

Field-effect Transistor

A transistor, which is a typical active electronic element, normally comprises a source electrode and a drain electrode connected to a transporting layer and a gate electrode which is disposed so as to apply an electric field to the transporting layer. By applying a voltage to the gate electrode, the current flowing between the source electrode and the drain electrode can be controlled or amplified. A structure comprising an insulating film formed between the gate electrode and the transporting layer is called MIS-FET type (Metal Insulator Semiconductor Field Effect Transistor) Transistors comprising a transporting layer comprising silicon are widely used.

In the field-effect transistor of the invention, the volume ratio of the organic polymer in the insulated gate film comprising the organic-inorganic composite insulating material for electronic element preferably falls within a range of from 10% to 30%.

A field-effect transistor which is an exemplary embodiment of implementation of the invention will be described in detail hereinafter.

The field-effect transistor according to the present embodiment of implementation of the invention comprises an insulated gate film comprising an organic-inorganic composite insulating material.

Figure 1:
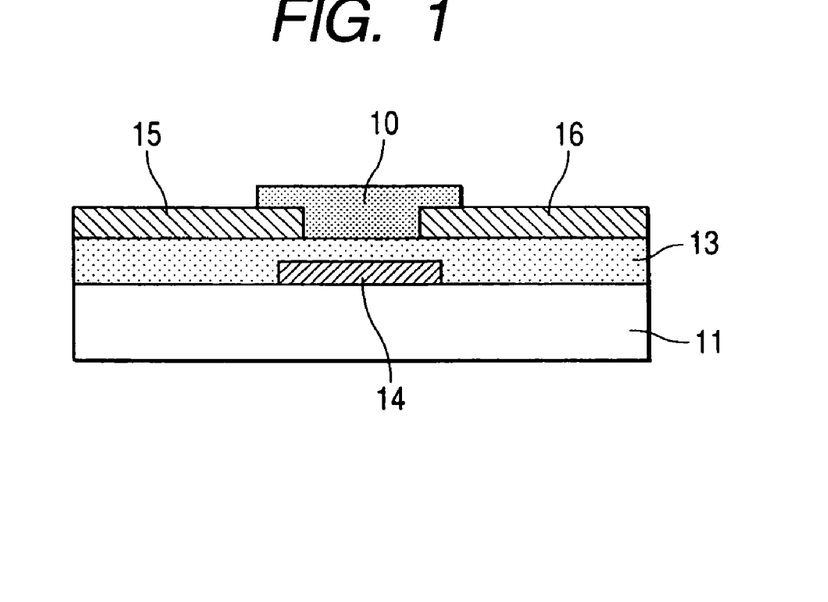
FIG. 1 is a typical sectional view of a field-effect transistor according to an exemplary embodiment of implementation of the invention.
Figure 2:
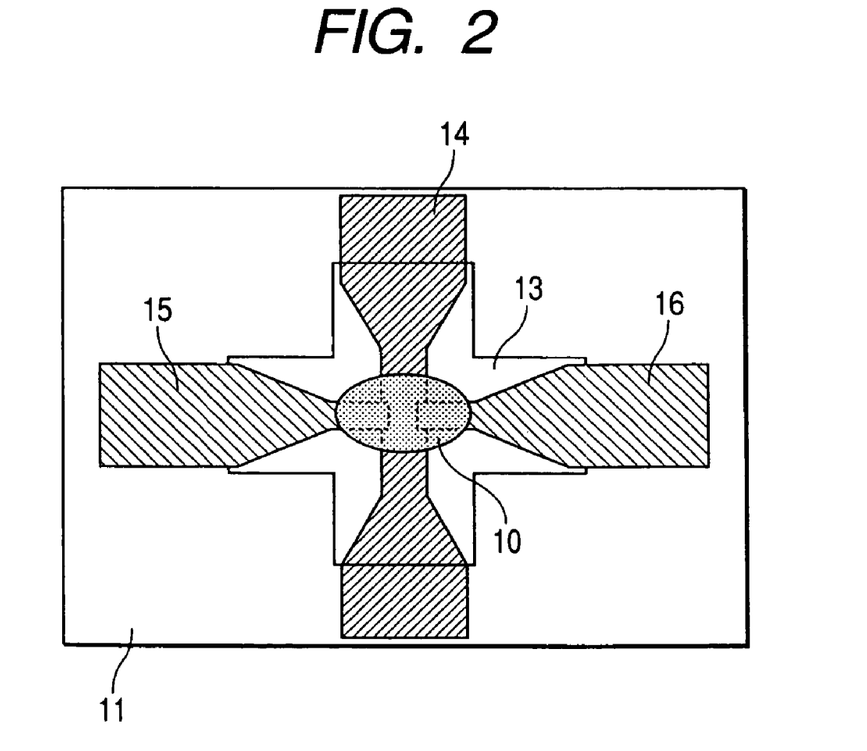
FIG. 2 is a plan view of the field-effect transistor of FIG. 1.

FIG. 1 is a side view of an MIS-FET type thin film transistor according to the present embodiment of implementation of the invention. FIG. 2 is a plan view of the MIS-FET type thin film transistor.

The field-effect transistor according to the present embodiment of implementation of the invention is prepared by sequentially laminating a gate electrode 14, an insulated gate film 13 comprising an organic-inorganic composite insulating material, a transporting layer 10, a source electrode 15 and a drain electrode 16 on the surface of a substrate 11 which is a polyethylene naphthalate (PEN) film.

As a transistor structure there may be used a multi-gate structure comprising a plurality of gate electrodes or a structure having a three-dimensional gate electrode for enhanced field effect on the transporting layer. Referring to the disposition of gate electrode, various structures such as top gate type and bottom gate type may be employed.

Electrode

As the electrode material constituting the gate electrode 14, the source electrode 15 and the drain electrode 16 there may be used any electrically-conductive material such as metal, e.g., gold, aluminum, copper, platinum, metal paste and organic material, e.g., electrically-conductive polymer. These materials may be properly selected in the light of adhesion to the substrate used. As a method of forming the electrode there may be used any conventional method. Examples of the method employable herein include method involving vacuum deposition using a mask, method using photolithography, and ink jet method.

Substrate

The material of the substrate 11 is not specifically limited. However, since the method of producing an organic-inorganic composite insulating material for electronic element of the invention is used, a low temperature process involving spreading can be conducted. Accordingly, a flexible substrate such as plastic sheet can be used to advantage.

When the substrate of the field-effect transistor of the invention is a resin substrate, the characteristics of the invention are exhibited.

Examples of such a flexible support include various resin films such as polyethylene terephthalate (PET), polyethylene naphthalate (PEN), polyethylene (PE), polystyrene (PS), polypropylene (PP), polyvinyl chloride (PVC), polyamide (PA) and polyimide (PI). Particularly preferred among these resin films is PEN film taking into account the thermal stability, gas barrier properties and transparency.

Transporting Layer

Examples of the semiconductor material to be used as transporting layer 10 include organic semiconductor materials such as crosslinked carbon nanotube structure, crosslinked carbon black structure, carbon nanotube, fullerenes, arsenic molecular materials, polythiophenes and thiophene oligomer, and inorganic microstructures such as silicon nanowire. At least one selected from the group consisting of these semiconductor materials may be used. Taking into account the spreadability or the stability of the carrier conducting channel, the organic polymer semiconductor, crosslinked nanotube structure and crosslinked carbon black structure are more desirable.

Insulated Gate Film

As already described, in the present embodiment, the insulated gate film 13 is composed of the organic-inorganic composite insulating material of the invention.

When the thickness of the insulated gate film is too great, a high gate voltage is required. Thus, the thickness of the insulated gate film is preferably 1,000 nm or less. Since the organic-inorganic composite insulating material of the invention has no particles dispersed therein, the thickness of the film can be reduced to a level of several nanometers without raising any problems of uniformity. However, the thickness of the insulated gate film is more preferably from 50 to 500 nm taking into account the ease of preparation also.

EXAMPLE

The invention will be further described in the following examples, but the invention should not be construed as being limited thereto.

Preparation of Coating Solution (Solution Mixture) for Insulating Film

Coating Solution for PVPh-dried Alumina Gel Insulating Film

A poly (4-vinylphenol) powder (produced by Aldrich Inc.) is dissolved in ethanol (produced by Wako Pure Chemical Industries, Ltd.) to prepare a 3 wt-% solution. Subsequently, an MOD coating material for aluminum (Al-03-P; aluminum alkoxide concentration: 3%; produced by Kojundo Chemical Lab. Co., Ltd) and a poly(4-vinylphenol) (PVPh) solution (3 wt-% solution of PVPh in ethanol as a solvent; hereinafter similar in the case where "PVPh solution" is referred to) are mixed at a volume ratio of 1:1 to prepare a coating solution (solution mixture) for insulating film.

Coating Solution for PVPh-dried Titania Gel Insulating Film

An MOD coating material for titanium oxide (Ti-03-P;

titanium alkoxide concentration: 3%; produced by Kojundo Chemical Lab. Co., Ltd) and a 3 wt-% solution of PVPh are mixed at a volume ratio of 1:1 in the same manner as in the aforementioned coating solution for PVPh-dried alumina gel insulating film to prepare a coating solution (solution mixture) for insulating film.

Example 1

The aforementioned coating solution for PVPh-dried alumina gel insulating film is dropped in an amount of 2 ml onto a PEN film (thickness: 125 μm) over which it is then spread by a spin coating method at 4,000 rpm. Thereafter, the coated material is heated to 90° C. over a hot plate in the atmosphere for 1 hour. Subsequently, the coated material is heated to 180° C. in a nitrogen atmosphere for 2 hours to form an organic-inorganic composite insulating material comprising PVPh-dried alumina gel insulating material (thickness: 500 nm; volume ratio of PVPh in the film: 30%).

Example 2

An insulating film is formed in the same manner as in Example 1 except that as the coating solution for insulating film there is used a coating solution for PVPh-dried titania gel insulating film instead of coating solution for PVPh-dried alumina gel insulating film. Thus, an organic-inorganic composite insulating material comprising PVPh-dried titania gel insulating material (thickness: 400 nm; volume ratio of PVPh in the film: 30%) is formed.

Comparative Example 1

An ethanol solution (3% by weight) of PVPh is dropped in an amount of 2 ml onto the same PEN film as used in Example 1 over which it is then spread. Thereafter, the solution is spread over the PEN film by a spin coating method at 4,000 rpm. The coated material is heated to 90° C. in the atmosphere for 1 hour, and then heated to 180° C. in a nitrogen atmosphere for 2 hours to form a PVPh film (thickness: 400 nm) as Comparative Example 1.

Comparative Example 2

The same MOD coating material for aluminum oxide (Al-03-P; aluminum alkoxide concentration: 3%; produced by Kojundo Chemical Lab. Co., Ltd) as used in the preparation of the coating solution for PVPh-dried alumina gel insulating film is dropped in an amount of 2 ml onto the same PEN film as used in Example 1 over which it is then spread by a spin coating method at 4,000 rpm. Thereafter, the coated material is heated to 90° C. in the atmosphere for 1 hour and then to 180° C. in a nitrogen atmosphere for 2 hours to form a dried alumina gel film (thickness: 500 nm) as Comparative Example 2.

Evaluation test on Examples 1 and 2 and Comparative Examples 1 and 2 and Their Results Measurement of Thermal Decomposition Temperature The insulating films of Example 1 (PVPh-dried alumina gel composite film), Comparative Example 1 (PVPh film) and Comparative Example 2 (dried alumina gel film) are each subjected to the following measurement of thermal decomposition temperature.

Using Diamond DSC produced by PerkinElmer Inc., these insulating films are each measured for thermal decomposition temperature in a nitrogen atmosphere at a temperature of from room temperature to 600° C.

Reflecting the fact that the dried alumina gel film of Comparative Example 2 is an inorganic material, it showed no thermal decomposition up to 600° C. On the other hand, PVPh of Comparative Example 1, which is an organic polymer, showed an endothermic peak accompanying thermal decomposition at about 400° C.

On the contrary, the PVPh-dried alumina gel composite film of Example 1 showed no thermal decomposition peak at about 400° C. due to PVPh. No peak appeared up to 600° C. As can be confirmed from this fact, the PVPh molecules are extremely fairly dispersed in the dried alumina gel to highly inhibit the thermal decomposition of PVPh.

IR Spectrum

The insulating films of Example 1 (PVPh-dried alumina gel composite film), Comparative Example 1 (PVPh film) and Comparative Example 2 (dried alumina gel film) are each measured for IR spectrum.

It is confirmed from the absorption at 1,530 cm$^{-1}$ and 1,310 cm$^{-1}$ reflecting Al—O—Al structure of alumina in IR spectrum that the PVPh-dried alumina gel composite film of Example 1 shows a definite spectrum as compared with the dried alumina gel film of Comparative Example 2, which is prepared under the same conditions, demonstrating that the aluminum alkoxide molecules which have made mutual action with the PVPh film can easily undergo reaction for the formation of Al—O—Al network structure on the surface of the polymer.

Chemical Resistance

The insulating films of Example 1 (PVPh-dried alumina gel composite film), Example 2 (PVPh-dried titania gel composite film), Comparative Example 1 (PVPh film) and Comparative Example 2 (dried alumina gel film) are each dipped in acetone and ethanol together with the PEN film as substrate for 3 hours to examine the chemical resistance thereof.

All the insulating films are not dissolved in any of the solvents except the PVPh film of Comparative Example 1, which is completely dissolved in any of the solvents. In some detail, the PVPh-dried alumina gel composite film of Example 1 and the PVPh-dried titania gel composite film of example 2 showed resistance to these solvents, not to mention the dried alumina gel film of Comparative Example 2 comprising inorganic polymer. As can be confirmed from this fact, the PVPh film is made insoluble in these solvents when provided in composite form.

Bend Resistance

The insulating films of Example 1 (PVPh-dried alumina gel composite film), Comparative Example 1 (PVPh film) and Comparative Example 2 (dried alumina gel film) are each subjected to bend resistance test together with the PEN film as a substrate. For the bend resistance test, these insulating films together with PEN film are each cut into a sample having a size of from 2 cm×2 cm. The samples are each bent a plurality of times in such an arrangement that the opposing sides thereof are brought into contact with each other. The samples are each observed for surface conditions before and after the test under a laser microscope to see the change of surface conditions. Of course, none of the samples showed cracking, etc.

After the bend resistance test, the PVPh film of Comparative Example 1 showed no change. However, the dried alumina gel of Comparative Example 2 showed numerous irregular cracks, demonstrating that the dried gel of inorganic polymer cannot be provided with sufficient flexibility.

On the contrary, the PVPh-dried alumina gel composite film of Example 1 showed no cracking, etc. even after the bend resistance test, demonstrating that the composite film of Example 1 didn't lose flexibility characteristic of PVPh, which is an organic polymer.

Example 3

Field-effect transistors (TFT) according to embodiments shown in FIGS. 1 and 2 comprising a PVPh-dried alumina gel composite film formed in the same manner as in Example 1 as an insulated gate film 13 are prepared.

As the transporting layer 10 there is used a semiconductive glycerin crosslinked film of carbon nanotube. As the gate electrode 14 there is used aluminum/gold. As the source electrode 15 and the drain electrode 16 there are each used titanium/gold. In this arrangement, a contact with the transporting layer 10 is formed. As the substrate 11 there is used a PEN film (thickness: 125 µm) which is a flexible substrate.

Preparation of Coating Solution for Semiconductive Glycerin Crosslinked Film of Carbon Nanotube (1) Purification of Single Layer Carbon Nanotube 30 mg of a powder (average particle diameter: 1.5 nm; average length: 2 µm) obtained by sifting a single layer carbon nanotube powder (purity: 40%, produced by Aldrich Inc.) through a sieve (pore diameter: 125 µm) to remove coarse agglomerates is heated to 450° C. in a muffle furnace for 15 minutes to remove carbon-based materials other than carbon nanotube. 15 mg of the residual powder is then dipped in 10 ml of a 5 N aqueous solution of hydrochloric acid {obtained by diluting concentrated hydrochloric acid (35% aqueous solution produced by KANTO KAGAKU CO., LTD.) twice with purified water} for 4 hours to dissolve the catalyst metal in the hydrochloric acid.

The solution thus obtained is filtered to recover the precipitate. The precipitate thus recovered is then subjected to heating and dipping in hydrochloric acid in the same manner as mentioned above. This step is further repeated three times to make purification. During this procedure, heating conditions are stepwise intensified, that is, 450° C. for 20 minutes, 450° C. for 30 minutes, 550° C. for 60 minutes.

It is made obvious that the carbon nanotube thus purified has a drastically enhanced purity (specifically estimated as 90% or more) as compared with that of the unpurified carbon nanotube (raw material). The purified carbon nanotube finally obtained had a weight of from 1 to 2 mg, which is about 5% of that of the raw material.

When the aforementioned procedure is repeated a plurality of times, 15 mg or more of a high purity single layer carbon nanotube powder is then obtained.

Figure 3:
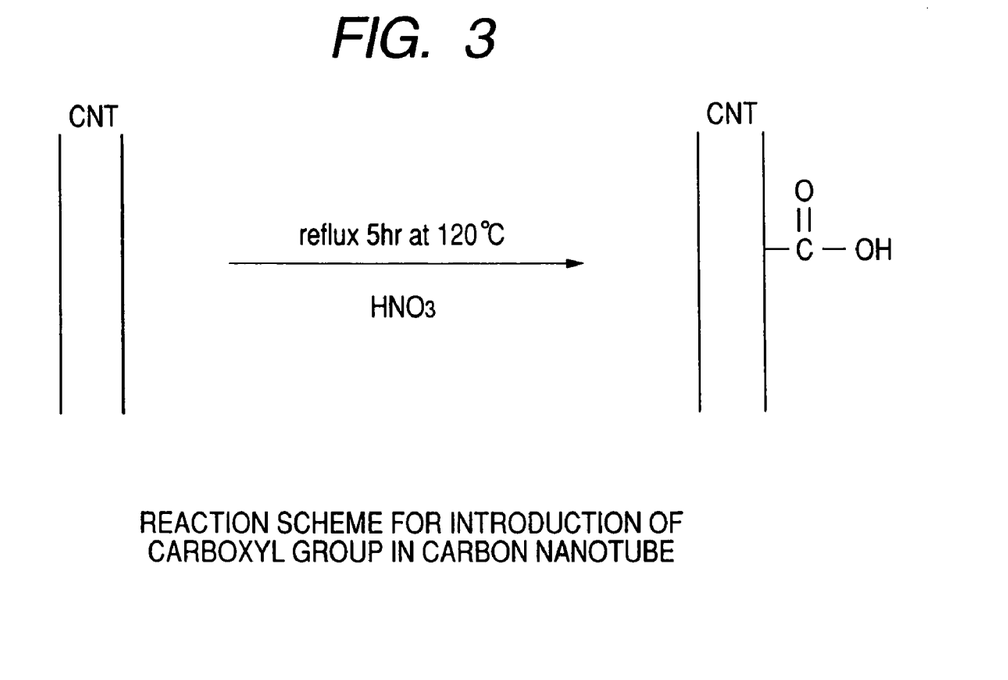
FIG. 3 illustrates the reaction scheme of synthesis of carbon nanotube carboxylic acid in the preparation of coating solution of semiconductive glycerin crosslinked film of carbon nanotube in Example 3.

(2) Addition of Carboxyl Group . . . Synthesis of Carbon Nanotube Carboxylic Acid 30 mg of a single layer carbon nanotube powder (purity: 90%; average diameter: 30 nm; average length: 3 µm, produced by SCIENCE LABORATOIES Inc.) is added to 20 ml of concentrated nitric acid (60 wt-% aqueous solution, produced by KANTO KAGAKU CO., LTD.). The mixture is heated to 120° C. under reflux for 5 hours to synthesize a carbon nanotube carboxylic acid. The aforementioned reaction scheme is shown in FIG. 3. In FIG. 3, the portion of carbon nanotube (CNT) is represented by two parallel lines (similar in other diagrams of reaction scheme).

The temperature of the solution is returned to room temperature where the solution is then subjected to centrifugal separation at 5,000 rpm for 15 minutes to separate the supernatant liquid and the precipitate from each other. The precipitate thus recovered is dispersed in 10 ml of purified water. The dispersion is then subjected to centrifugal separation at 5,000 rpm for 15 minutes to separate the supernatant liquid and the precipitate from each other (cleaning step is conducted once). This cleaning step is repeated more five times. The precipitate is finally recovered.

The precipitate thus recovered is then measured for infrared absorption spectrum. For comparison, the raw material of single layer carbon nanotube used is itself measured for infrared absorption spectrum. The comparison of the two results of spectrum shows that absorption at 1,735 $cm^{-1}$ characteristic of carboxylic acid which is not observed with the raw material of single layer carbon nanotube itself is observed with the aforementioned precipitate. This demonstrates that the reaction with nitric acid causes the introduction of carboxyl group in the carbon nanotube. In other words, it is confirmed that the precipitate is a carbon nanotube carboxylic acid.

When the precipitate thus recovered is added to neutral purified water, it is then confirmed that the precipitate has a good dispersibility. This result substantiates the results of infrared spectrum that a hydrophilic carboxyl group has been introduced in the carbon nanotube.

Figure 4:
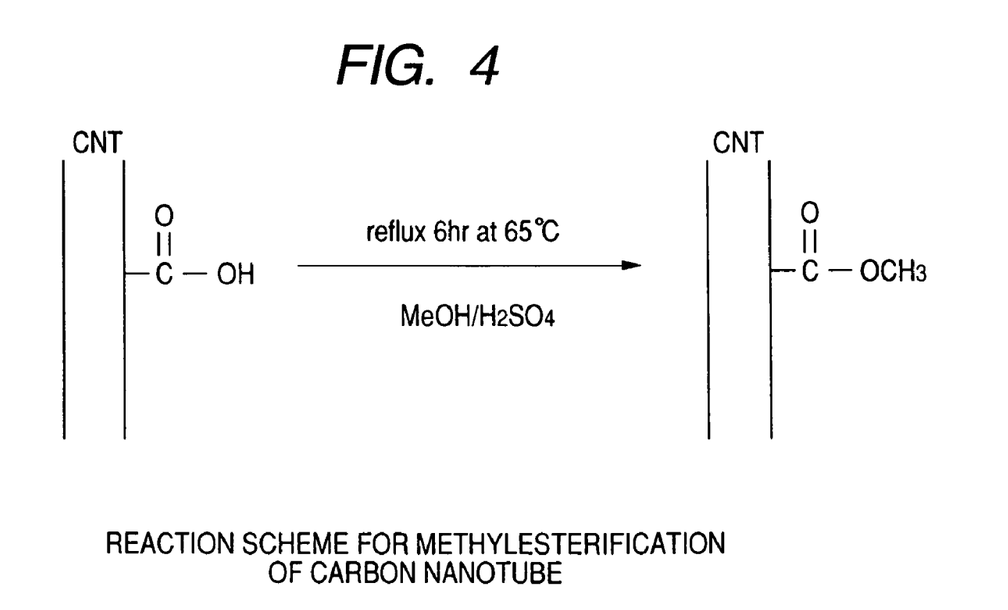
FIG. 4 illustrates the reaction scheme of esterification in the preparation of coating solution of semiconductive glycerin crosslinked film of carbon nanotube in Example 3.

(3) Esterification 30 mg of the carbon nanotube carboxylic acid prepared at the aforementioned step is added to 25 ml of methanol (produced by Wako Pure Chemical Industries, Ltd.). To the mixture is then added 5 ml of concentrated sulfuric acid (98% by weight, produced by Wako Pure Chemical Industries, Ltd.) The mixture is then heated to 65° C. under reflux for 6 hours to make methylesterification. The aforementioned reaction scheme is shown in FIG. 4.

The temperature of the solution is returned to room temperature. The solution is then filtered to separate the precipitate therefrom. The precipitate is rinsed and recovered. The precipitate thus recovered is then measured for infrared spectrum. As a result, absorption at 1,735 $cm^{-1}$ and from 1,000 to 1,300 $cm^{-1}$, which is characteristic of ester, is observed, demonstrating that the carbon nanotube carboxylic acid had been esterified.

Mixing Step 30 mg of the carbon nanotube carboxylic acid thus methyesterified is added to 4 g of glycerin (produced by KANTO KAGAKU CO., LTD.). The mixture is then stirred by an ultrasonic dispersing machine. The mixture is then added to 4 g of methanol which is a viscosity adjustor to prepare a coating solution of semiconductive glycerin crosslinked film of carbon nanotube (hereinafter referred to as "crosslinked coating solution (1)").

Preparation of Field-effect Transistor

Aluminum and gold are vacuum-deposited on a PEN film (produced by Teijin DuPont Films Japan Limited) which had been previously heat-treated at 190° C. for 1 hour as a substrate 11 to a thickness of 10 nm and 40 nm, respectively, by a photolithographic process to form a gate electrode 14.

Subsequently, 2 ml of the aforementioned coating solution of PVPh-dried titania gel insulating film is spread over the gate electrode 14 at 4,000 rpm by a spin coating method. The coated material is then heated to 90° C. in the atmosphere for 1 hour. Subsequently, the coated material is heated to 180° C. in a nitrogen atmosphere for 2 hours to form an insulated gate film 13.

Titanium and gold are then vacuum-deposited on the insulated gate film 13 to a thickness of 10 nm and 40 nm, respectively, by a photolithographic process to form a source electrode 15 and a drain electrode 16.

Figure 5:
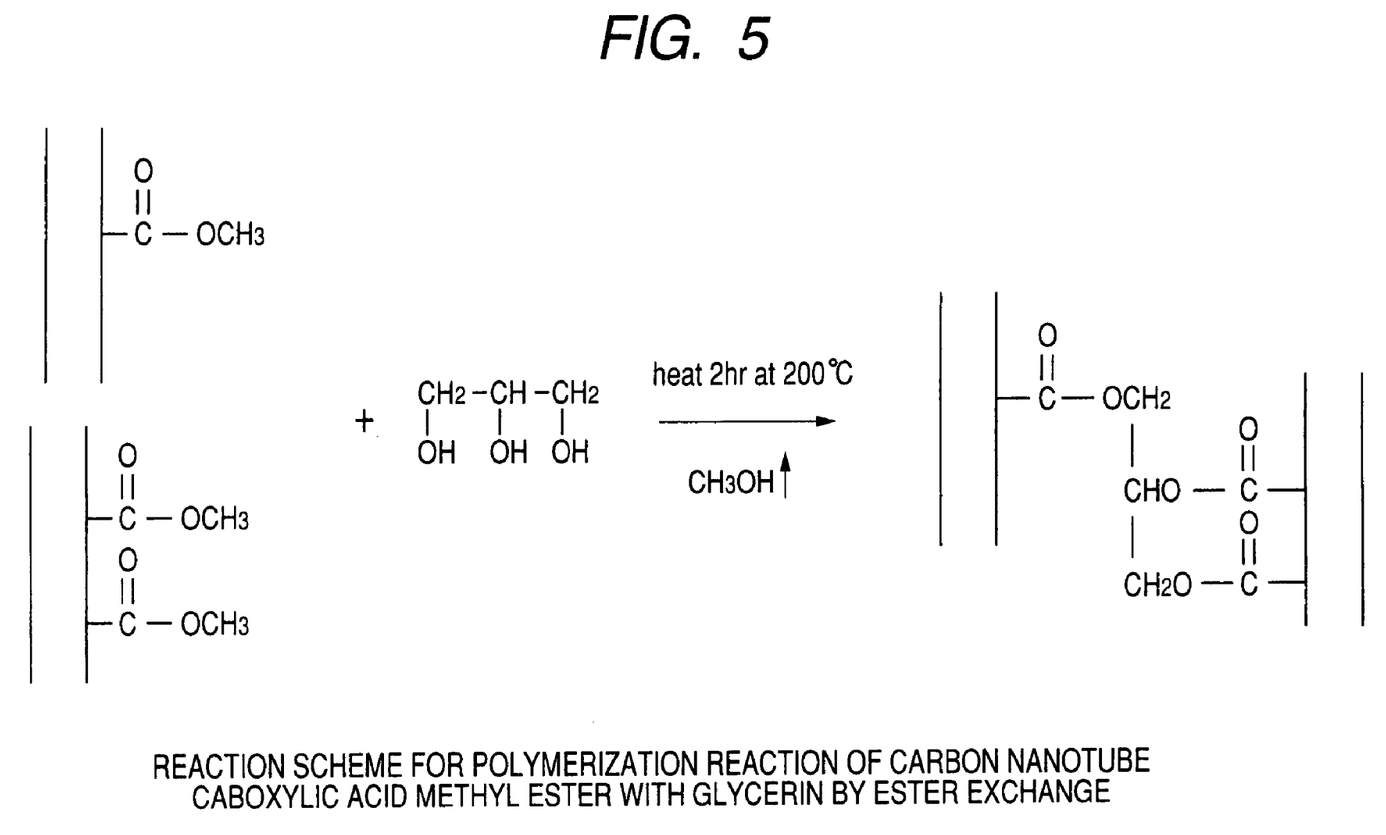
FIG. 5 illustrates the reaction scheme of crosslinking (curing) of the crosslinked coating solution by ester exchange reaction during the formation of the transporting layer (semiconductor layer) in Example 3.

Finally, the aforementioned crosslinked coating solution (1) is spread over the area between the source electrode 15 and the drain electrode 16. The substrate 11 over which the coat film had been formed as a transporting layer (semiconductor layer) 10 is heated to 140° C. for 1 hour to cure the coat film. As a result, a TFT structure is formed. The reaction scheme is shown in FIG. 5.

The insulated gate film 13 thus formed had a thickness of 500 nm and a dielectric constant of 6 (1 KHz). The volume ratio of PVPh in the film is 30%.

Thus, a field-effect transistor of Example 3 is prepared.

Example 4

A field-effect transistor is prepared in the same manner as in Example 3 except that a PVPh-dried titania gel composite film formed in the same manner as in Example 2 is used as an insulated gate film 13. The insulated gate film 13 thus formed had a thickness of 400 nm and a dielectric constant of 14 (1 KHz). The volume ratio of PVPh in the film is 30%.

Thus, a field-effect transistor of Example 4 is prepared.

Evaluation Test on Examples 3 and 4 and Their Results

Using a Type 4156B semiconductor parameter analyzer (produced by Agilent Technologies, Inc.), the field-effect transistors of Examples 3 and 4 are each measured for drain current-drain voltage characteristics with respect to voltage Vgs of gate electrode and gate leak current Igs. The measurement is conducted in the atmosphere.

Figure 6:
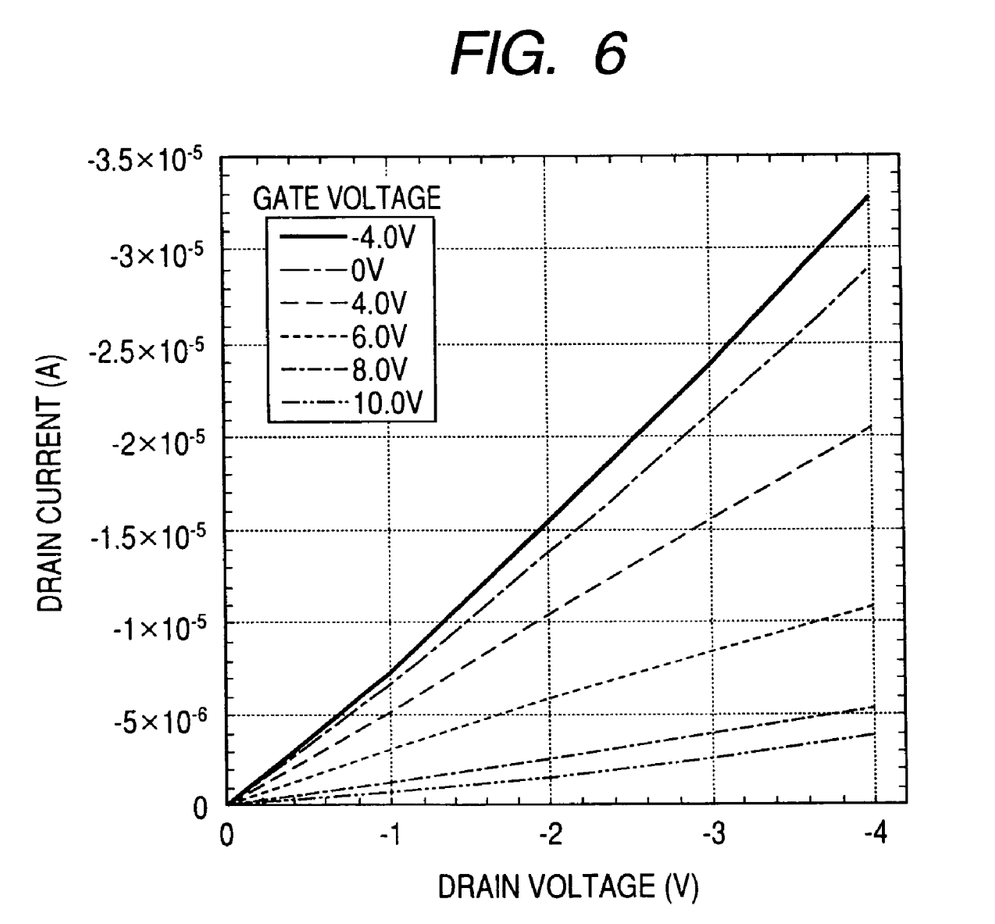
FIG. 6 is a graph (FET characteristic chart) illustrating the drain current-drain voltage vs. gate electrode voltage Vgs characteristics of the field-effect transistor of Example 3, which comprises a PVPh-dried alumina gel composite film as an insulated gate film.

The measurements (FET characteristic chart) of the field-effect transistor of Example 3, which comprises a PVPh-dried alumina gel composite film as an insulated gate film 13 are shown in FIG. 6. As can be confirmed in the graph of FIG. 6, the PVPh-dried alumina gel composite film acts as an insulated gate film for field-effect transistor.

Further, the field-effect transistor of Example 3 showed no breakdown even at a gate voltage of 20 V. It is also made obvious that the field-effect transistor of Example 3 exhibits a dielectric strength of 40 kV/mm or more.

Figure 7:
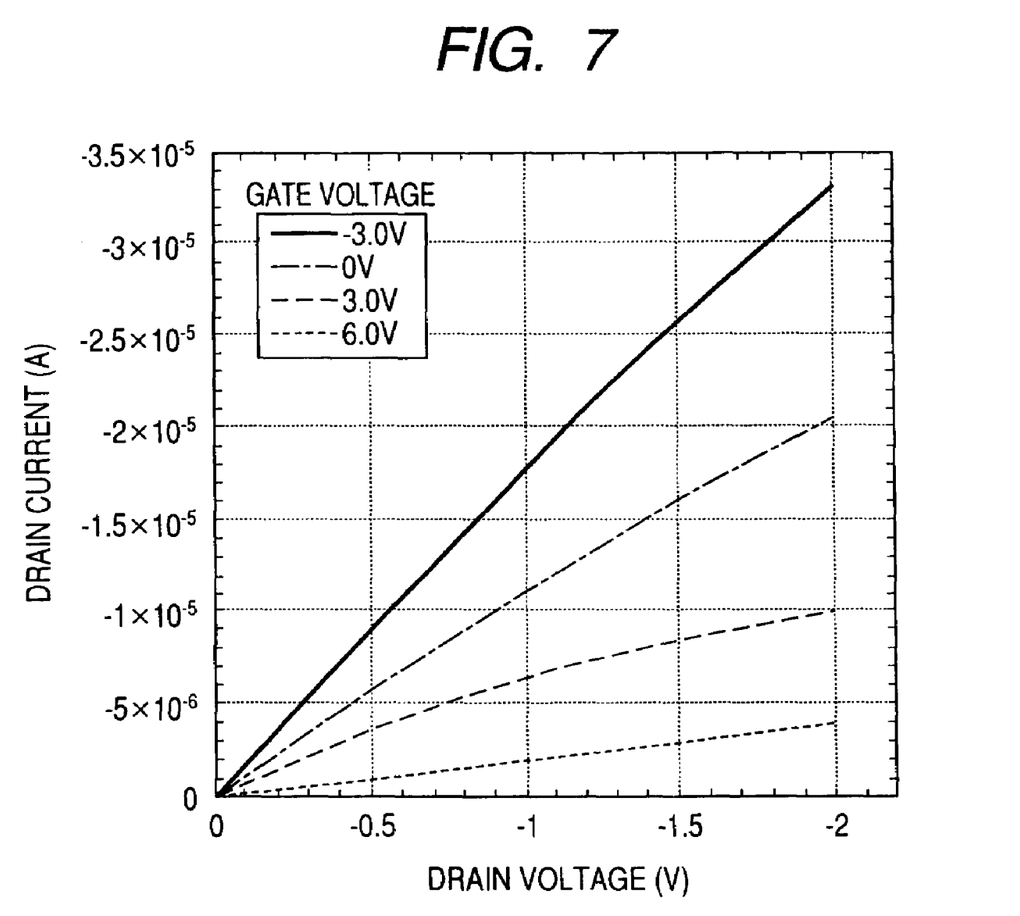
FIG. 7 is a graph (FET characteristic chart) illustrating the drain current-drain voltage vs. gate electrode voltage Vgs characteristics of the field-effect transistor of Example 4, which comprises a PVPh-dried titania gel composite film as an insulated gate film.

On the other hand, the measurements (FET characteristic chart) of the field-effect transistor of Example 4, which comprises a PVPh-dried titania gel composite film as an insulated gate film 13, are shown in FIG. 7. As can be confirmed in the graph of FIG. 7, the PVPh-dried titania gel composite film acts as an insulated gate film for field-effect transistor. A high response to gate voltage reflecting the high dielectric constant of titania is confirmed. The field-effect transistor of Example 4 showed no breakdown even at a gate voltage of 10 V. It is also made obvious that the field-effect transistor of Example 4 exhibits a dielectric strength of 20 kV/mm or more.

In accordance with the invention, an insulating film which can be prepared at low temperatures and compensate the lack of dielectric constant and chemical resistance characteristic of organic polymers and the lack of flexibility characteristic of inorganic insulating film can be provided at reduced cost. Therefore, a flexible insulated gate film having a high dielectric constant can be obtained, making it possible to provide a high performance field-effect transistor at reduced cost.

The entire disclosure of Japanese Patent Application No. 2004-373200 filed on Dec. 24, 2004 including specification, claims, drawings and abstract is incorporated herein by reference in its entirely.

What is claimed is:

1. An organic-inorganic composite insulating material for electronic element, comprising an organic polymer dispersed in an inorganic polymer structure, wherein the organic-inorganic composite insulating material is produced by subjecting a mixture of an organic polymer or its solution and a metal alkoxide or its solution as a starting material to sol-gel reaction of the metal alkoxide in the presence of the organic polymer, and wherein the volume ratio of the organic polymer falls within a range of from 1% to 50%.

2. The organic-inorganic composite insulating material for electronic element as defined in claim 1, wherein the organic polymer has a hydroxyl group.

3. The organic-inorganic composite insulating material for electronic element as defined in claim 1, wherein the organic polymer is a polyvinyl phenol.

* * * * *